United States Patent
Kimura et al.

(10) Patent No.: US 9,474,192 B2
(45) Date of Patent: Oct. 18, 2016

(54) HOUSING FOR ELECTRONIC EQUIPMENT AND MANUFACTURING METHOD THEREOF

(71) Applicant: Fujitsu Limited, Kawasaki-shi, Kanagawa (JP)

(72) Inventors: Koichi Kimura, Kawasaki (JP); Masanobu Ishiduka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 489 days.

(21) Appl. No.: 13/893,646

(22) Filed: May 14, 2013

(65) Prior Publication Data

US 2013/0248105 A1  Sep. 26, 2013

Related U.S. Application Data

(60) Division of application No. 12/431,976, filed on Apr. 29, 2009, now abandoned, which is a continuation of application No. PCT/JP2006/321740, filed on Oct. 31, 2006.

(51) Int. Cl.
*H05K 13/00* (2006.01)
*B32B 7/12* (2006.01)
(Continued)

(52) U.S. Cl.
CPC ............. *H05K 13/00* (2013.01); *B32B 7/12* (2013.01); *B32B 15/08* (2013.01); *B32B 27/308* (2013.01);
(Continued)

(58) Field of Classification Search
CPC ...... H05K 13/00; H05K 5/0243; B32B 7/12; B32B 15/08; B32B 27/36; B32B 27/308; B32B 27/365; B32B 2255/06; B32B 2255/10; B32B 2255/26; B32B 2307/4023; B32B 2307/422; B32B 2307/538; B32B 2307/75; B32B 2457/00; B32B 2509/00; B32B 2559/00; Y10T 156/10; Y10T 428/31507; Y10T 428/31681; Y10T 428/31678; Y10T 428/31696

See application file for complete search history.

(56) References Cited

U.S. PATENT DOCUMENTS 3,770,560 A   11/1973  Elder et al.
4,115,619 A    9/1978  Kurfman et al.
(Continued)

FOREIGN PATENT DOCUMENTS

CN    2817297 Y    9/2006
JP    09-252185 A  9/1997
(Continued)

OTHER PUBLICATIONS

Chinese Office Action dated Aug. 9, 2010, issued in corresponding Chinese Patent Appication No. 200680056241.1.
(Continued)

*Primary Examiner* — Michael C Miggins
(74) *Attorney, Agent, or Firm* — Westerman, Hattori, Daniels & Adrian, LLP

(57) ABSTRACT

A method for manufacturing a housing for an electronic equipment containing metal housing configured to house an electronic equipment therein and a resin film with which the metal housing is coated includes the steps of heating a resin film so as to soften the resin film, coating a metal housing with the heated resin film, and adhering the coated resin film to the metal housing. The preferred housing is one in which an adhesive layer, a print layer, or both thereof is disposed between a resin layer contained in the resin film and the metal housing, and in which the resin film contains at least one thermoplastic resin selected from the group consisting of polycarbonate (PC), polyethylene terephthalate (PET), polymethyl methacrylate (PMMA), and polylactic acid (PLA).

6 Claims, 6 Drawing Sheets

(51) Int. Cl.
   *B32B 15/08*    (2006.01)
   *B32B 27/36*    (2006.01)
   *H05K 5/02*     (2006.01)
   *B32B 27/30*    (2006.01)

(52) U.S. Cl.
   CPC ............ B32B 27/36 (2013.01); B32B 27/365 (2013.01); H05K 5/0243 (2013.01); *B32B 2255/06* (2013.01); *B32B 2255/10* (2013.01); *B32B 2255/26* (2013.01); *B32B 2307/4023* (2013.01); *B32B 2307/422* (2013.01); *B32B 2307/538* (2013.01); *B32B 2307/75* (2013.01); *B32B 2457/00* (2013.01); *B32B 2509/00* (2013.01); *B32B 2559/00* (2013.01); *Y10T 156/10* (2015.01); *Y10T 428/31507* (2015.04); *Y10T 428/31678* (2015.04); *Y10T 428/31681* (2015.04); *Y10T 428/31696* (2015.04)

(56) References Cited

U.S. PATENT DOCUMENTS

| | | |
|---|---|---|
| 4,241,129 A | 12/1980 | Marton et al. |
| 4,849,295 A | 7/1989 | Dickerman et al. |
| 4,977,003 A | 12/1990 | Brown et al. |
| 5,360,647 A | 11/1994 | Sumida |
| 5,858,579 A | 1/1999 | Ito et al. |
| 6,346,320 B2 | 2/2002 | Doteguchi et al. |
| 7,122,251 B2 | 10/2006 | Tezuka et al. |
| 7,419,560 B2 | 9/2008 | Sinsel et al. |
| 2004/0142176 A1 | 7/2004 | Wang |
| 2006/0054249 A1 | 3/2006 | Kimura et al. |
| 2007/0224408 A1 | 9/2007 | Kimura et al. |
| 2007/0276079 A1* | 11/2007 | Saiki ................... C09D 133/04 524/493 |
| 2009/0043034 A1 | 2/2009 | Ishiduka et al. |
| 2009/0263672 A1 | 10/2009 | Sinsel et al. |

FOREIGN PATENT DOCUMENTS

| | | |
|---|---|---|
| JP | 11-026979 A | 1/1999 |
| JP | 2000-208953 A | 7/2000 |
| JP | 2001-315162 A | 11/2001 |
| JP | 2003-094555 A | 4/2003 |
| JP | 2003-160898 A | 6/2003 |
| JP | 2004-228238 A | 8/2004 |
| JP | 3641233 B2 | 4/2005 |
| JP | 2006-213618 A | 8/2006 |

OTHER PUBLICATIONS

Japanese Office Action dated Sep. 6, 2011, issued in corresponding Japanese Patent Application No. 2008-541940 with an English translation.

International Search Report of PCT/JP2006/321740, date of mailing May 15, 2007.

* cited by examiner

HOUSING FOR ELECTRONIC EQUIPMENT AND MANUFACTURING METHOD THEREOF

CROSS-REFERENCE TO RELATED APPLICATIONS

This application is a divisional application of U.S. patent application Ser. No. 12/431,976 filed Apr. 29, 2009, which is a continuation application of PCT/JP2006/321740, filed on Oct. 31, 2006.

FIELD

The present invention relates to a housing for an electronic equipment, and a manufacturing method of the housing.

BACKGROUND

As a consequence of the standardization for current CPU or inner structural parts, it is getting more difficult to make a difference in electronic equipments such as personal computers, digital cameras, digital video cameras, cell phones and the like. In order to distinguish the electronic equipment from other electronic equipments available in the market, it is necessary to improve decorativeness, such as color tone, gloss and the like, with respect to the external appearance of the housing of the electronic equipment.

To provide housings for electronic equipments with improved portability, a highly rigid plastic formed by adding carbon fibers (CF) or glass fibers (GF) to polycarbonate (PC) resin or polyamide (PA) resin, a material formed by immersing carbon fibers (CF) in thermosetting plastic, and the like are used. To provide housings for electronic equipments with improved decorativeness, a metallic multi-layered coating added with alumina powder, and a piano-gloss coating by applying a clear coating have been applied. It is expected that there will be more demands for the housings for electronic equipments to have patterns, characters, or pictures printed thereon in the future.

It has been known that the housing formed of Mg alloy tends to cause molding failures such as sink mark, void, flow line (seam) and the like at high rate. These molding failures (sink mark, void, flow line (seam) etc.) lead to failures of the external appearance even after coating. Therefore, it is necessary to process the Mg alloy housing by manually coating putty, or applying a UV coating, to compensate these molding failures before the coating is applied, and this leads to the increase in cost. Namely, the Mg alloy housing has problems such as difficulties in molding, low mass-productivity, requiring smoothing treatment of the surface after molding, and the like.

Moreover, the spray coating which is applied for improving the decorativeness of the housing requires an undercoat (primer) and overcoat, and thus it tends to cause the failures of the external appearance due to the contamination of foreign substances other than the materials to be used, and to lower production yield. Especially with the gloss coating for imparting metallic appearance, as the coating needs to be applied a few times, the production yield tends to be lowered because of the contamination of dust or waste.

As mentioned above, there are many problems in improving both the production yield and decorativeness of the housing of an electronic equipment. For example, it is difficult to provide the Mg alloy housing with excellent decorativeness at low cost. Moreover, the problems associated with the decorativeness are caused likewise in the case of metal housings of Al or Ti, or plastic housings, other than that of Mg alloy (see Japanese Patent Application Laid-Open (JP-A) No. 2003-160898 and Japanese Patent (JP-B) No. 3641233).

SUMMARY

Accordingly, it is an object in one aspect of the invention to provide a housing for an electronic equipment, which contains a metal housing configured to house an electronic equipment therein, and a resin film with which the metal housing is coated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENTS

Hereinafter, the embodiments of the present invention will be explained with reference to the drawings, but the following embodiments shall not be construed to limit the present invention.

(Housing for Electronic Equipment)

Figure 1:
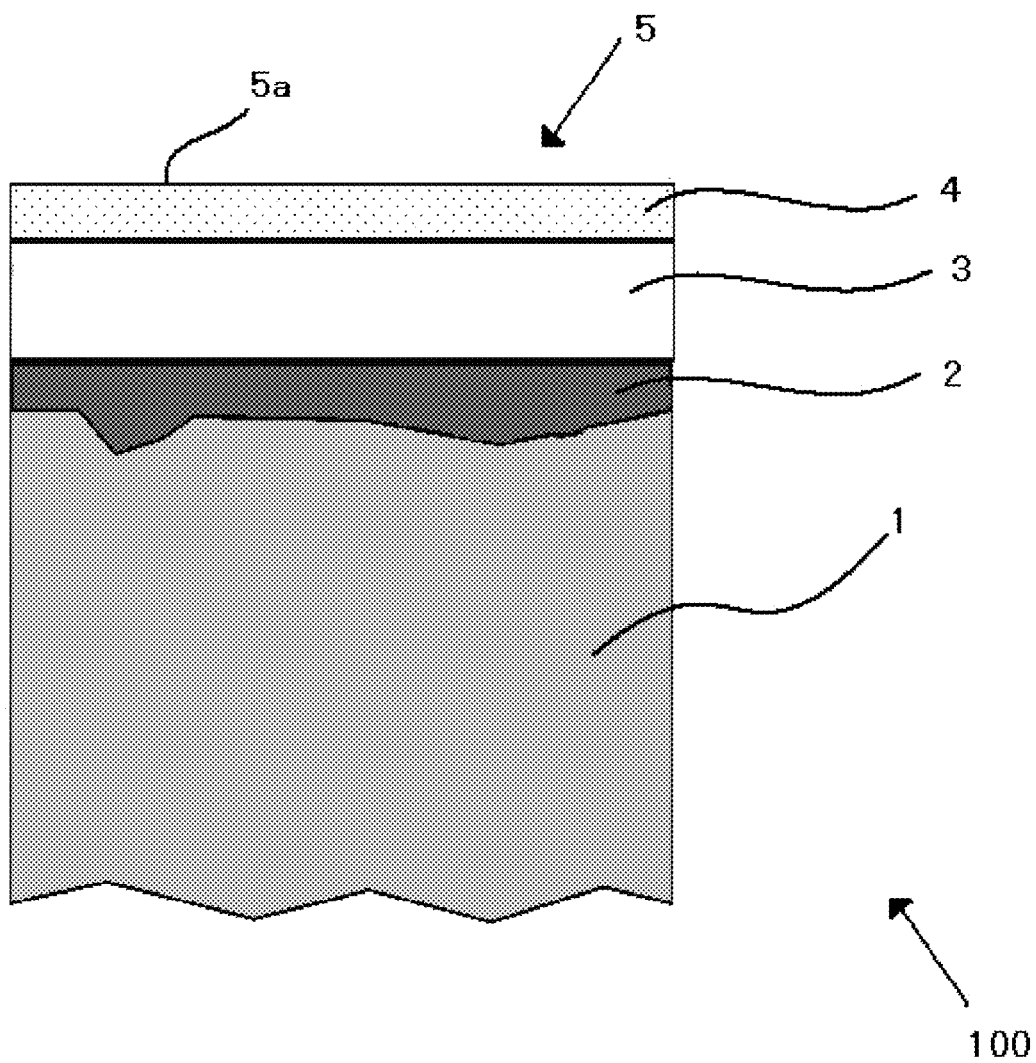
FIG. 1 is a cross-sectional view showing an example of the structure of the housing for the electronic equipment of the present invention.

The housing for an electronic equipment of the present invention includes a metal housing, a resin film coated on the metal housing, and other members. For example, the housing of an electronic equipment 100 includes the metal housing 1, the resin film 5 coated on the metal housing 1, and other members, as shown in FIG. 1.

—Metal Housing—

Figure 2:
FIG. 2 is a projection view of the Mg alloy housing as the metal housing shown in FIG. 1.

The metal housing 1 is configured to house an electronic equipment therein. For example, the metal housing is a Mg alloy housing formed of Mg alloy (AZ91D:Al 9% by mass, Zn 1% by mass) (see FIG. 2). The metal housing 1 is preferably formed of a metal such as Mg alloy, Al ally, Ti ally, pure Al or the like, but it may be formed of a resin.

—Resin Film—

The resin film 5 has a thickness of 0.1 mm to 1.0 mm, and is a laminate of an adhesive layer 2 formed on the metal housing 1, a print layer 3 formed on the adhesive layer 2, and a resin layer 4 formed on the print layer 3. When the resin film 5 has the adhesive layer 2, the metal housing 1 and the resin film 5 are strongly adhered.

The resin film 5 (resin layer 4) preferably contains a thermoplastic resin selected from the group consisting of polycarbonate (PC), polyethylene terephthalate (PET), polymethyl methacrylate (PMMA), and polylactic acid (PLA). When the resin film 5 (resin layer 4) contains a thermoplastic resin selected from the group consisting of polycarbonate (PC), polyethylene terephthalate (PET), polymethyl methacrylate (PMMA), and polylactic acid (PLA), the production yield and decorativeness (decoration-workability) of the housing for an electronic equipment 100 are improved compared to the case where other thermoplastic resin is contained.

Moreover, the surface 5$a$ of the resin film 5 coated on the metal housing 1 may be applied with any surface treatments such as a friction resistant coating for enhancing the strength, hydrophobic coating for preventing stains, and the like, and may further be coated or applied with the shapes, such as concave-convex shapes.

Furthermore, the surface 5$a$ of the resin film 5 may be subjected to the coating treatment with a coating agent, such as a coating agent containing antibacterial agent, e.g. silver, a coating agent containing a photocatalyst, e.g. titanium oxide, a hydrophobic coating agent for inhibiting finger prints to be remained on the surface, or the like.

—Adhesive Layer—

As the adhesive layer 2, thermosetting adhesive, photo-curing adhesives and the like may be used, but it is preferred that the adhesive layer 2 contain flexible thermoplastic rubber such as nitrile rubber, chloroprene rubber, and the like, or a hot-melt adhesive, in view of handling or recycling. When the adhesive layer 2 contains the thermoplastic rubber such as nitrile rubber or chloroprene rubber, the deformation caused by the difference in the thermal expansion between the metal housing 1 and the resin film 5 can be presented, and the metal housing 1 and the resin film 5 are separated by a reheating treatment so that the housing for an electronic equipment 100 can be separated and recycled.

Moreover, the adhesive layer 2 preferably contains inorganic filler such as calcium carbonate, talc, aluminum powder, and the like. When the adhesive layer 2 contains the inorganic filler, they provide the same effects as the putty associated with the adhesive constituting the adhesive layer 2, such as nitrile rubber or chloroprene rubber, to the portions of the molding failures (sink mark, void, flow line (seam) and the like) on the metal housing 1. When the aluminum powder is contained in the adhesive layer 2 as filler, the metal housing 1 is prevented from lowering the gloss thereof. Note that, the lowing of the gloss is caused due to the influences of the adhesive layer 2 on the print layer 3 and the resin layer 4.

For example, as the adhesive layer 2, a nitrile rubber adhesive (CEMEDINE 521, manufactured by CEMEDINE CO., LTD.) having a thickness of 0.2 mm added with 10% by mass of talc (K-1, manufactured by NIPPON TALC Co., Ltd.), or a chloroprene rubber adhesive (CEMEDINE 575, manufactured by CEMEDINE CO., LTD.) having a thickness of 0.1 mm added with 5% by mass of aluminum powder (SUPER FINE No. 22000, manufactured by YAMATO METAL POWDER CO., LTD.) is used.

The thickness of the adhesive layer 2 is preferably the range of 0.05 mm to 0.5 mm.

The amount of the inorganic filler is preferably 1% by mass to 20% by mass with respect to the mass of the adhesive layer 2.

—Print Layer—

The print layer 3 may be any print of character, pattern, mono-color or color, regardless of materials of inks such as pigments, dyes, and may be applied with a photoluminescence substance or florescence substance. With the formation of the print layer 3, the housing for an electronic equipment 100 of the present invention enables to easily attain metallic appearance or gloss, which is generally difficult to apply with conventional coatings, and to easily improve design and decorativeness thereof. Note that, the print layer 3 (ink layer) can provide the same effect even when it is formed at the outer most layer of the resin film 5 or under the resin layer 4.

—Resin Layer—

As the resin layer 4, for example, a PC sheet (IUPILON FE2000-M12, manufactured by Mitsubishi Engineering-Plastic Corporation) having a thickness of 0.3 mm or an A-PET sheet (NOVACLEAR SH046, manufactured by Mitsubishi Plastics, Inc.) having a thickness of 0.5 mm can be used.

When the PC sheet is used as the resin layer 4, the hardness of the surface portion of the resin film 5 can be easily improved.

When the A-PET sheet is used as the resin layer 4, the resin layer can track the shape of the side wall or R-shaped portion of the metal housing 1, and thus the metal housing 1 of the complicated shape can be covered with the resin film 5.

Moreover, by subjecting the resin layer 4 to the surface treatment, e.g. a UV cation hard coat, acryl hard coat, plating, or vapor deposition, the hardness of the surface of the resin film can be easily improved.

—Other Members—

The housing for an electronic equipment 100 optionally contains other members, as necessary.

As mentioned above, the print layer 3 contributes to the improvement of the design and decorativeness and the adhesive layer 2 contributes to the improvement of the production yield. Accordingly, the molding failures (sink mark, void, flow line (seam) etc.) on the surface of the metal housing 1 can be covered by covering the metal housing 1 with the resin film 5, and for example, a coating for compensate the molding failures will not be required. As a result, the housing for an electronic equipment 100 can achieve the improvement in both the production yield and decorativeness (decoration-workability).

Moreover, by covering the metal housing 1 with the resin film 5, the surface configuration of the housing for an electronic equipment 100 (metal housing 1) can be arbitrarily designed. For example, touching feel can be improved by applying embossing treatment on the resin layer 4 of the resin film 5, slipping on the surface can reduced by controlling the surface roughness of the resin layer 4 of the resin film 5, or glossiness can be freely adjusted.

(Manufacturing Method of Housing for Electronic Equipment)

The manufacturing method of a housing for an electronic equipment of the present invention contains an adhesive layer formation step, and an air-pressure formation step.

—Adhesive Layer Formation Step—

Before applying the resin film 5 (the print layer 3 and the resin layer 4) on the metal housing 1, an adhesive and inorganic filler are applied to the metal housing 1 to form an adhesive layer 2 which will constitute part of the resin film later. The adhesive layer 2 is formed by a spray coating (screen print) until the thickness thereof becomes 0.2 mm. As a result of the formation of the adhesive layer 2 on the surface of the metal housing 1 by the spray coating or screen print, the portions of the molding failures (sink mark, void, flow mark (seam), etc.) on the metal housing 1 are filled with the adhesive and the inorganic filler, and thus the effect equivalent to the putty coating can be attained, and the filling effect on the surface of the metal housing 1 is enhanced.

Thereafter, heat drying is performed at 60° C. for 30 minutes, the solvent contained in the adhesive is evaporated, and then the adhesive is solidified. As a result of this, adhesion of the adhesive is suppressed, and thus contamination of foreign substances is prevented. Moreover, handling becomes easy in terms of portability or setting in a die, and therefore operations are simplified.

—Air-Pressure Formation Step—

The air-pressure formation step includes a heating step, which is heating the resin film 5 (the print layer 3 and the resin layer 4) so as to soften the resin film 5, a coating step, which is coating the metal housing 1 with the heated resin film 5, an adhering step, which is adhering the covering resin film 5 to the metal housing 1, and a cutting step, which is cutting off the resin film 5 that is not adhered to the metal housing 1. This air-pressure formation step is the step in which the elements of the vacuum formation, which will be described later, are introduced into the air-pressure formation.

The air-pressure formation is a method in which the softened sheet by heating is adhered to the mold by the compressed air of 3 kg/cm to 5 kg/cm (0.03 kg/m to 0.05 kg/m) so as to obtain the predetermined shape, and is more suitable in the case where a formation of a precise shape is required, compared to the vacuum formation which will be described later. As the surface which is in contact with the mold can be made a surface of a final product, a sharp design equivalent to that from the injection molding can be realized, and thus the shape of undercut or reentrant can be formed.

Note that, the vacuum formation is a formation method in which the softened sheet resin by heating is pressed onto the concave or convex mold, the air trapped between the sheet resin and the mold is sucked from the bottom so as to create the condition close to the vacuumed condition, the sheet resin is adhered to the mold, and then the sheet resin is shaped into the predetermined shape. This vacuum formation is applied in the formation of a simple configuration, such as a spoiler or cowling for a motor cycle, and enables to produce products in a short period at low cost, especially in the case where only one face of a molded object is replicated, such as the case of a trial manufacturing of a model or the like.

In the manufacturing method of the housing for an electronic equipment 100 of the present invention, an air-pressure formation device 30 as shown in FIGS. 3 to 6 is used for the air-pressure formation to coat the metal housing 1 with the resin film 5 (the print layer 3 and the resin layer 4).

Figure 3:
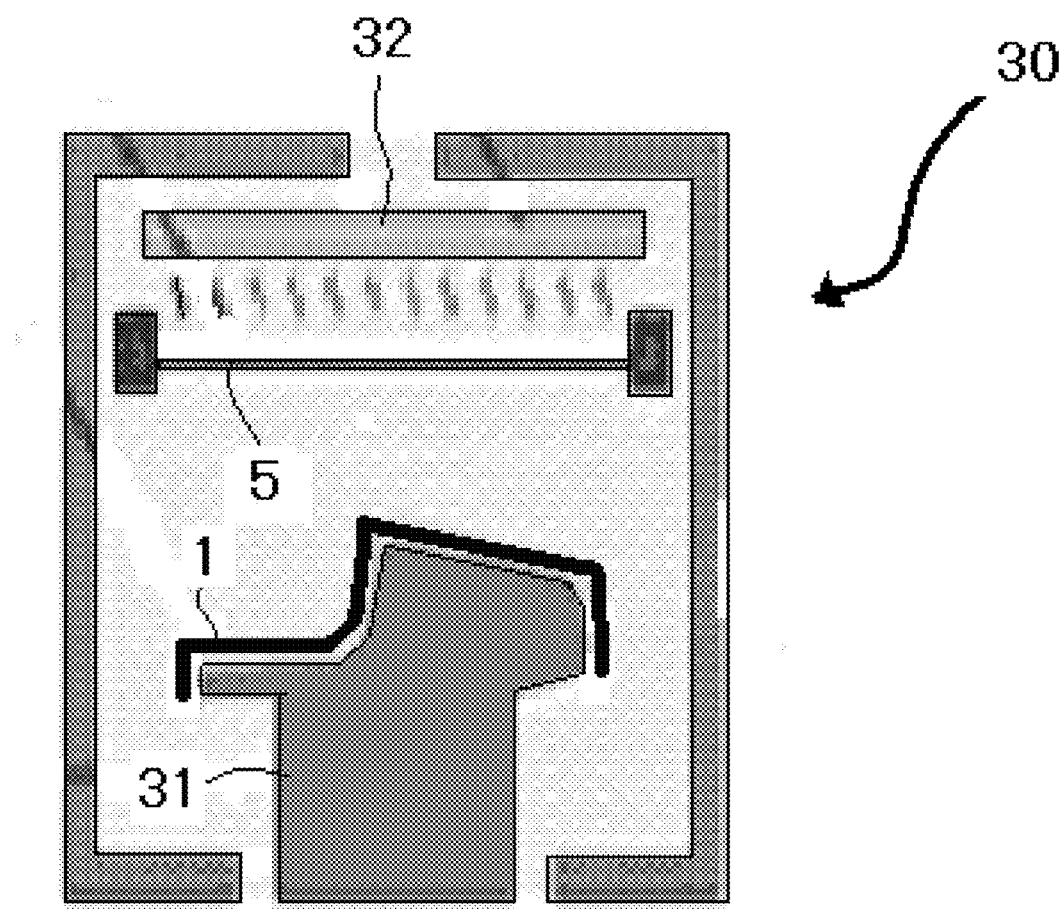
FIG. 3 is a schematic diagram illustrating an example of the manufacturing method of the housing for the electronic equipment of the present invention, and showing the step of heating the resin film.
Figure 4:
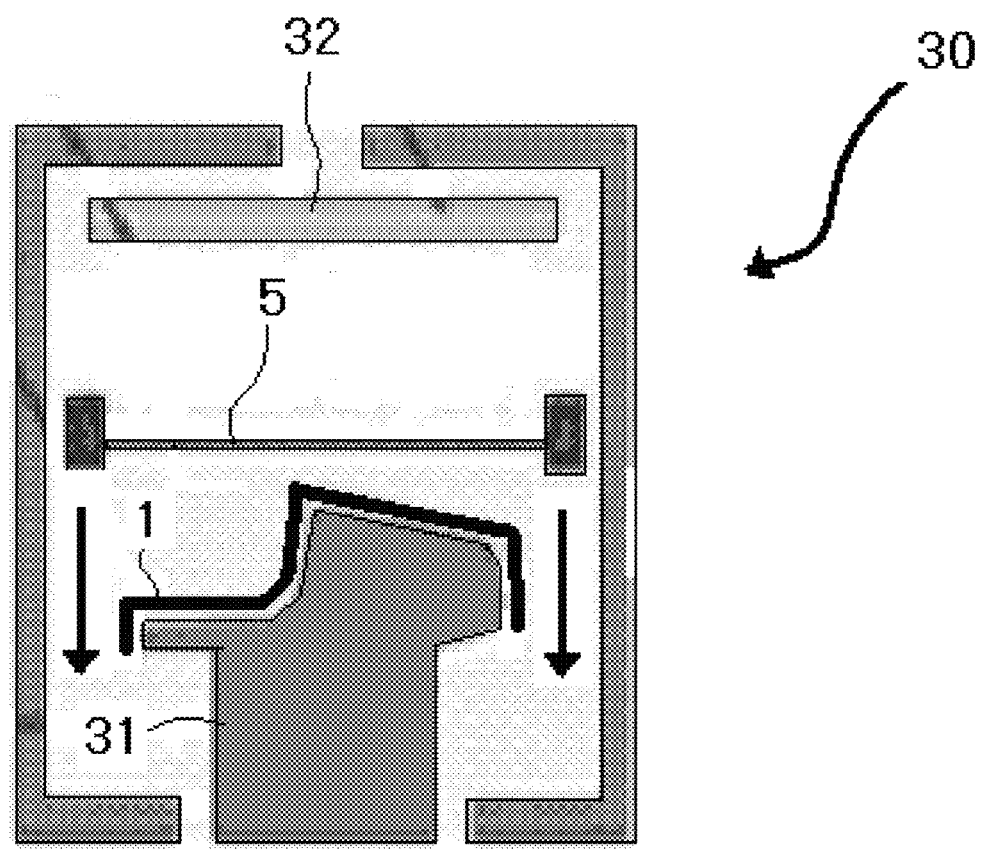
FIG. 4 is a schematic diagram illustrating an example of the manufacturing method of the housing for the electronic equipment of the present invention, and showing a step of adhering the metal housing to the resin film.
Figure 5:
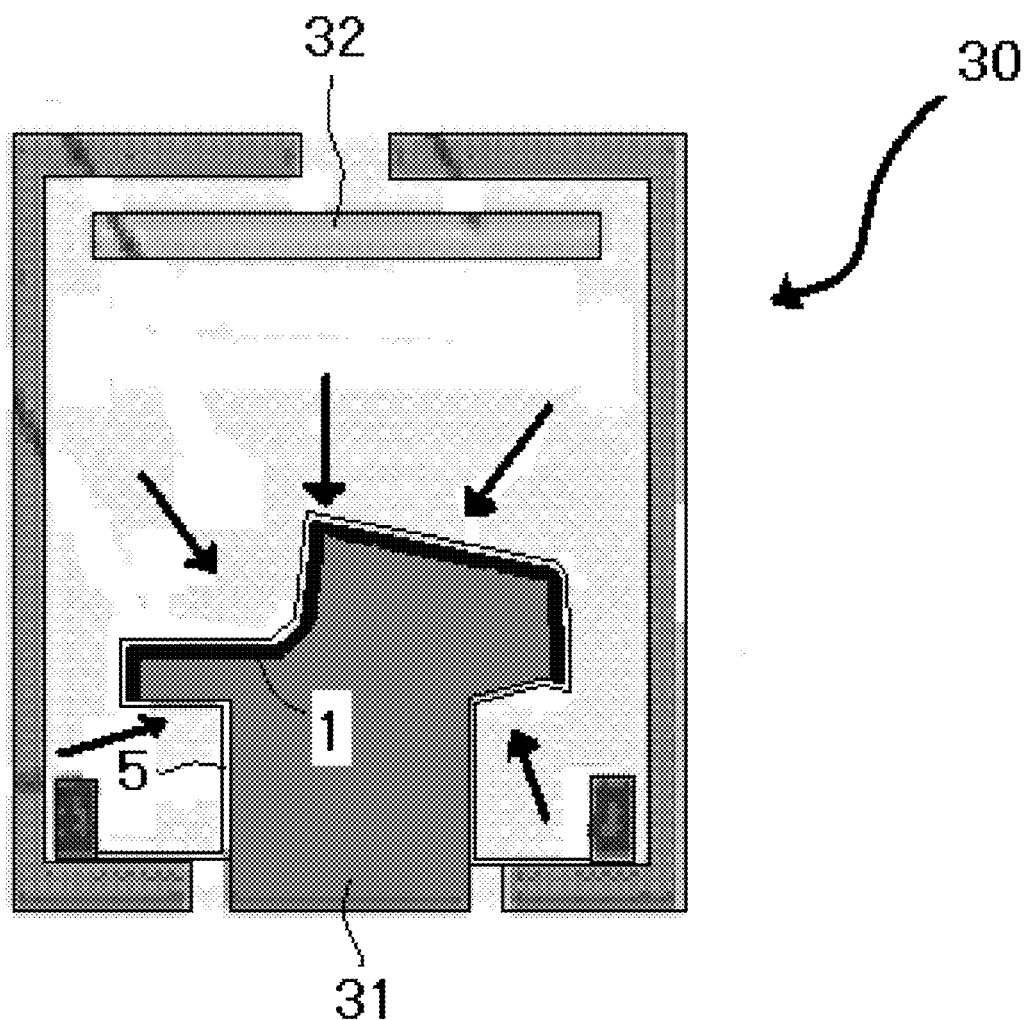
FIG. 5 is a schematic diagram illustrating an example of the manufacturing method of the housing for the electronic equipment of the present invention, and showing a step of curling the resin film in the back side of the edge of the metal housing and adhering the resin film to the metal housing.
Figure 6:
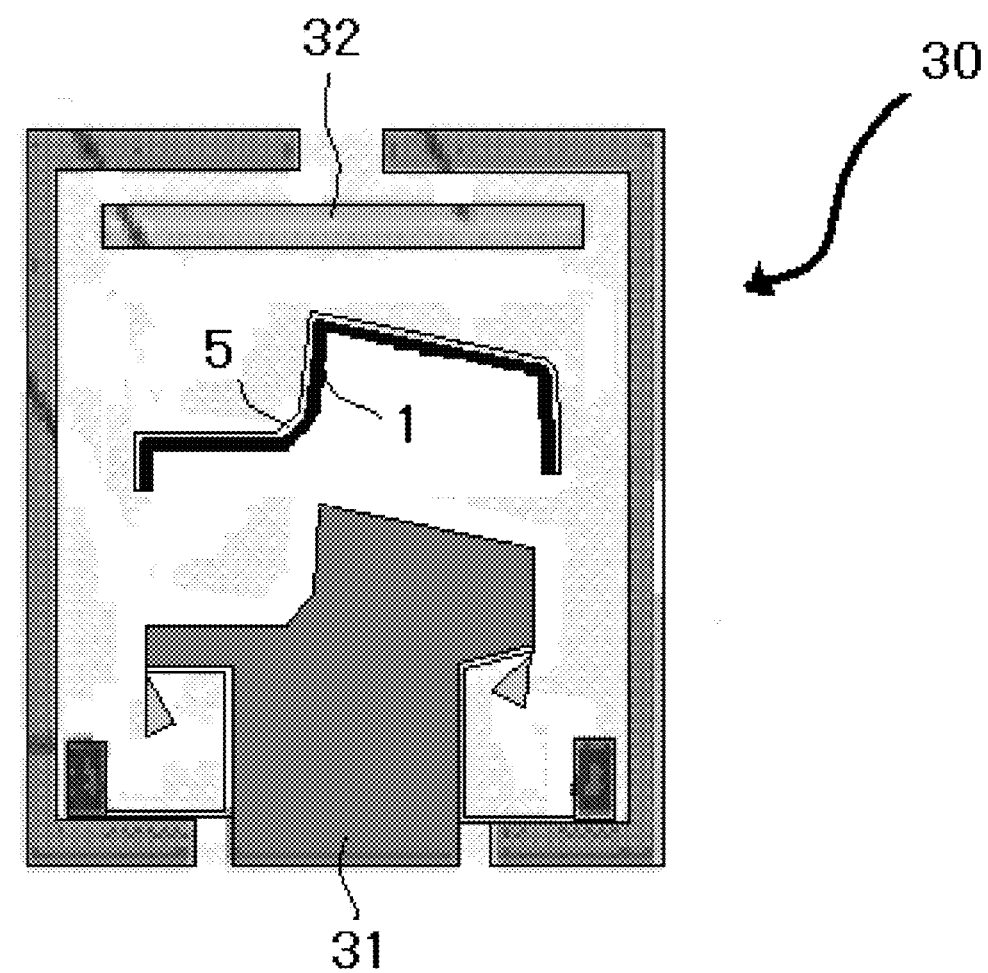
FIG. 6 is a schematic diagram illustrating an example of the manufacturing method of the housing for the electronic equipment of the present invention, and showing a step of trimming (removing unnecessary portions).

At first, the metal housing 1 is set to the concave or convex mold 31, and the resin film 5 is heated with a heater 32 so as to soften the resin film 5 (see FIG. 3). At this time, the surface temperature of the resin film 5 is adjusted depending on the material of the resin film 5. For example, the surface temperature of the resin film 5 is set at 130° C. in the case where the material of the resin film 5 is polycarbonate (PC). After softening the resin film 5, the metal housing 1 is coated with the resin film 5 (see FIG. 4). The resin film 5 is pressed against the concave or convex mold 31 to which the metal housing 1 is set, the air trapped between the metal housing 1 (the resin film 5) and the mold 31 is sucked from the bottom so as to make the internal atmosphere of the air-pressure formation device 30 vacuumed, and then the metal housing 1 and the resin film 5 are adhered. At this time, the compressed air of 5 kg/cm (0.05 kg/m) is blown from the upstream of the resin film 5 so that the metal housing 1 and the resin film 5 are brought into close contact with the mold 31, and the resin film 5 is formed into the shape of the metal housing 1 (see FIG. 5). Here, the adhesive layer 2 is refused, and strongly adheres the resin film 5 to the metal housing 1. The anchor effect caused by wrapping the resin film 5 around the side of the metal housing 1 or the like contributes to the adhesion. Thereafter, the resin film 5 that is not adhered to the metal housing 1 is cut off (trimmed off) (see FIG. 6) to thereby obtain the housing for an electronic equipment 100.

According to the manufacturing method of the present invention, as the metal housing 1 is coated with the resin film 5 and the highly designed metal housing 1 is easily decorated, the mass production is realized at low cost.

Hereinafter, examples of the present invention will be specifically explained, but the examples shall not be construed to limit the present invention.

Example 1

A housing for an electronic equipment in which a Mg alloy housing formed of Mg alloy (AZ91D: Al 9% by mass, Zn 1% by mass) was coated with a resin film having a thickness of 0.7 mm by the aforementioned air-pressure formation was prepared. The coated resin film consisted of a 0.5 mm-thick A-PET sheet (NOVACLEAR SH046, manufactured by Mitsubishi Plastics Inc.) as a resin layer, a 0.1 mm-thick print layer, and a layer in which 5% by mass of aluminum powder (SUPER FINE No. 22000, manufactured by YAMATO METAL POWDER CO., LTD.) was added to a 0.1 mm-thick chloroprene rubber adhesive (CEMEDAIN 575, manufactured by CEMEDAIN CO., LTD.).

Comparative Example 1

A housing for an electronic equipment in which a urethane coating was sprayed onto a Mg alloy housing formed of Mg alloy (AZ91D: Al 9% by mass, Zn 1% by mass) was prepared.

The glossiness of the housings for an electronic equipment of Example 1 and Comparative Example 1 were respectively evaluated with a gloss checker IG-331 (manufactured by HORIBA, Ltd.). As a result, it was found that the glossiness of the housing for an electronic equipment of Example 1 was 60, whereas the glossiness of the housing for an electronic equipment of Comparative Example 1 was 45 From these results, it was confirmed that the housing for an electronic equipment of Example 1 had easily achieved high glossiness.

Comparative Example 2

A housing for an electronic equipment in which a Mg alloy housing formed of Mg alloy (AZ91D: Al 9% by mass, Zn 1% by mass) was coated with a resin film having a thickness of 0.7 mm by the aforementioned air-pressure formation was prepared in the same manner as in Example 1. The coated resin film consisted of a 0.5 mm-thick A-PET sheet (NOVACLEAR SH046, manufactured by Mitsubishi Plastics, Inc.) as a resin layer, a 0.1-thick print layer, and a 0.1 mm-thick chloroprene rubber adhesive (CEMEDINE 575, manufactured by CEMEDINE CO., LTD.) as an adhesive layer, and no inorganic filler was added thereto.

The housings of Example 1, and Comparative Examples 1 and 2 were subjected to the measurement for the amount of sink marks. The amount of the sink marks was measured on the concave-convex shape formed on the surface of the housing for an electronic equipment by using a surface profiler (Dektak30 30ST, manufactured by ULVAC, Inc.). As a result, the amount of the sink marks on the housing for an electronic equipment of Example 1 was 10 μm or less, whereas the amounts of Comparative Examples 1 and 2 were 50 μm and 30 μm, respectively. From these results, it was found that, the housing for an electronic equipment of Example 1 had the small amount of the sink marks, and molding failures could be easily covered.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A method for manufacturing a housing for an electronic equipment, comprising:
    applying an adhesive containing thermoplastic rubber and inorganic filler to a metal housing;
    heating a resin film so as to soften the resin film;
    coating the metal housing with the heated resin film; and
    adhering the coated resin film to the metal housing.

2. The method for manufacturing a housing for an electronic equipment according to claim 1, wherein the inorganic filler contains aluminum powder.

3. The method for manufacturing a housing for an electronic equipment according to claim 1, further comprising, after the applying the adhesive, heating and drying the adhesive.

4. The method for manufacturing a housing for an electronic equipment according to claim 3, further comprising forming a print layer between a resin layer included in the resin film and the metal housing.

5. The method for manufacturing a housing for an electronic equipment according to claim 1, wherein the thermoplastic rubber contains nitrile rubber or chloroprene rubber or both thereof.

6. The method for manufacturing a housing for an electronic equipment according to claim 5, wherein the inorganic filler contains aluminum powder.

* * * * *